US012363932B2

(12) United States Patent
Nongaillard et al.

(10) Patent No.: US 12,363,932 B2
(45) Date of Patent: *Jul. 15, 2025

(54) ELECTRONIC DEVICE PROVIDED WITH A STACK OF TWO HIGH ELECTRON MOBILITY TRANSISTORS ARRANGED IN A BRIDGE HALF-ARM

(71) Applicants: STMicroelectronics France, Montrouge (FR); STMicroelectronics International N.V., Geneva (CH)

(72) Inventors: Matthieu Nongaillard, Grenoble (FR); Thomas Oheix, Grenoble (FR)

(73) Assignees: STMicroelectronics France, Montrouge (FR); STMicroelectronics International N.V., Geneva (CH)

( * ) Notice: Subject to any disclaimer, the term of this patent is extended or adjusted under 35 U.S.C. 154(b) by 389 days.

This patent is subject to a terminal disclaimer.

(21) Appl. No.: 17/736,767

(22) Filed: May 4, 2022

(65) Prior Publication Data

US 2022/0359714 A1 Nov. 10, 2022

(30) Foreign Application Priority Data

May 5, 2021 (FR) ...................................... 2104752

(51) Int. Cl.
*H10D 30/01* (2025.01)
*H01L 25/07* (2006.01)
(Continued)

(52) U.S. Cl.
CPC ......... *H10D 30/015* (2025.01); *H01L 25/074* (2013.01); *H10D 30/475* (2025.01); *H10D 62/8503* (2025.01)

(58) Field of Classification Search
CPC ......... H01L 29/41766; H01L 29/66462; H01L 29/4175; H01L 27/0694; H01L 29/7813;
(Continued)

(56) References Cited

U.S. PATENT DOCUMENTS

2009/0167411 A1 7/2009 Machida et al.
2009/0206363 A1 8/2009 Machida et al.
(Continued)

FOREIGN PATENT DOCUMENTS

EP 2731132 A2 5/2014
EP 3293758 A1 3/2018

OTHER PUBLICATIONS

Jones et al., "Application-Based Review of GaN HFETs," 2014 IEEE Workshop on Wide Bandgap Power Devices and Applications, Oct. 2014, pp. 24-29.
(Continued)

*Primary Examiner* — Alia Sabur
(74) *Attorney, Agent, or Firm* — Seed IP Law Group LLP

(57) ABSTRACT

The disclosure concerns an electronic device comprising, stacked from a first surface to a second surface, a first stack and a second stack of two high electron mobility transistors, referred to as first and second transistor, the first and the second stack each comprising, from an insulating layer, interposed between the first and the second stack, a barrier layer and a channel layer, the first and the second transistor respectively comprising a first and a second set of electrodes, the first and the second set of electrodes being each provided with a source electrode, with a drain electrode, and with a gate electrode which are arranged so that the first and the second transistor form a half-arm of a bridge.

20 Claims, 8 Drawing Sheets

(51) Int. Cl.
*H10D 30/47* (2025.01)
*H10D 62/85* (2025.01)

(58) Field of Classification Search
CPC .......... H01L 29/7803; H10D 88/101; H10D 30/014; H10D 30/015
See application file for complete search history.

(56) References Cited

U.S. PATENT DOCUMENTS

| | | | |
|---|---|---|---|
| 2011/0095358 A1* | 4/2011 | Micciche' | H01L 29/7397 438/270 |
| 2013/0234207 A1 | 9/2013 | Choi et al. | |
| 2013/0320354 A1 | 12/2013 | Treu et al. | |
| 2014/0091366 A1* | 4/2014 | Jeon | H01L 21/8252 257/195 |
| 2014/0131887 A1 | 5/2014 | Lee et al. | |
| 2014/0266324 A1 | 9/2014 | Teo et al. | |
| 2015/0014698 A1 | 1/2015 | Briere | |
| 2015/0048420 A1 | 2/2015 | Leomant et al. | |
| 2015/0069615 A1 | 3/2015 | Ohno et al. | |
| 2015/0279670 A1 | 10/2015 | Cho et al. | |
| 2017/0040312 A1 | 2/2017 | Curatola et al. | |
| 2021/0296452 A1 | 9/2021 | Hanson et al. | |
| 2021/0376135 A1 | 12/2021 | Kwan et al. | |
| 2022/0320325 A1 | 10/2022 | Nongaillard et al. | |
| 2022/0336651 A1 | 10/2022 | Nongaillard et al. | |

OTHER PUBLICATIONS

Shi et al., "A High-Performance GaN E-mode Reverse Blocking MISHEMT with MIS Field Effect Drain for Bidirectional Switch," *Proceedings of the 29th International Symposium on Power Semiconductor Devices & ICs*, Sapporo, Japan, May 28, 2017, pp. 207-210.

Wen et al., "A Dual-Mode Driver IC With Monolithic Negative Drive-Voltage Capability and Digital Current-Mode Controller for Depletion-Mode GaN HEMT," *IEEE Transactions on Power Electronics* 32(1):423-432, Jan. 2017.

* cited by examiner

ELECTRONIC DEVICE PROVIDED WITH A STACK OF TWO HIGH ELECTRON MOBILITY TRANSISTORS ARRANGED IN A BRIDGE HALF-ARM

CROSS-REFERENCE TO RELATED APPLICATION(S)

This application claims the priority benefit of French patent application number FR2104752, filed on May 5, 2021, entitled "ELECTRONIC DEVICE PROVIDED WITH A STACK OF TWO HIGH ELECTRON MOBILITY TRANSISTORS ARRANGED IN A BRIDGE HALF-ARM," which is hereby incorporated by reference to the maximum extent allowable by law."

BACKGROUND

Technical Field

The disclosure relates to the field of electronics, and more particularly of power electronics. More particularly, the present disclosure concerns an electronic device provided with two high electron mobility transistors.

The device according to the present disclosure is in some implementations arranged to allow a better integration of the two high electron mobility transistors.

The arrangement provided in the present disclosure enables in this respect to obtain a compact device enabling to form a half-arm of a bridge.

Description of the Related Art

High electron mobility transistors ("HEMT") are now widely implemented in the field of hyperfrequencies and that of switches for power electronics converters.

In this regard, HEMT transistors are generally elaborated from layers of group III-V semiconductor materials and more particularly group III-N semiconductor materials.

BRIEF SUMMARY

The aim of the disclosure is achieved by an electronic device comprising, stacked from a first surface to a second surface, a first stack and a second stack of two high electron mobility transistors, referred to as first and second transistor, the first and the second stack each comprising, from an insulating layer, interposed between the first and the second stack, a barrier layer and a channel layer, the first and the second transistor respectively comprising a first and a second set of electrodes, the first and the second set of electrodes being each provided with a source electrode, with a drain electrode, and with a gate electrode which are arranged so that the first and the second transistor form a half-arm of a bridge.

According to an implementation mode, the source electrode of the first transistor, referred to as first source electrode, and the drain electrode of the second transistor, referred to as second drain electrode, are connected to each other.

According to an implementation mode, the first source electrode and the second drain electrode form a single electrode, referred to as intermediate electrode and which extends from the first stack to the second stack.

According to an implementation mode, the intermediate electrode emerges, by one of its ends referred to as intermediate end, flush with one or the other of the first and of the second surface.

According to an implementation mode, an intermediate pad is arranged on one of the first surface or of the second surface and in line with the intermediate electrode by its intermediate end, the intermediate pad in some implementations comprising a doped semiconductor material.

According to an implementation mode, the drain electrode of the first transistor, referred to as first drain electrode, extends in the insulator layer and all the way into the channel layer of said first stack, and the source electrode of the second transistor, referred to as second source electrode, extends in the insulating layer and all the way into the channel layer of said second stack.

According to an implementation mode, said electronic device comprises a drain pad and a source pad arranged, respectively, on the first surface and the second surface, and respectively contacting the first drain electrode and the second source electrode, the drain pad and the source pad in some implementations comprising a doped semiconductor material.

According to an implementation mode, the channel layers of one and the other of the first and of the second transistor are each capable of forming a conduction layer in the form of a two-dimensional electron gas.

According to an implementation mode, the gate electrodes of one and the other of the first and of the second transistor, respectively referred to as first gate electrode and second gate electrode, are configured to independently impose, respectively, to the first transistor and to the second transistor, the switching from one of the conductive and non-conductive state to the other one of these two states.

According to an implementation mode, said device also comprises a first gate pad and a second gate pad respectively arranged on the first surface and the second surface, the first gate pad being configured to electrically contact the first gate electrode and the second gate pad being configured to electrically contact the second gate electrode, the first gate pad and the second gate pad in some implementations comprising a doped semiconductor material.

According to an implementation mode, the insulating layer comprises a dielectric material, in some implementations silicon dioxide or silicon nitride.

According to an implementation mode, the first stack and the second stack are essentially identical.

According to an implementation mode, the first and the second transistor have an identical threshold voltage.

According to an implementation mode, the two channel layers comprise GaN and the barrier layers comprise an AlGaN ternary alloy.

BRIEF DESCRIPTION OF THE SEVERAL VIEWS OF THE DRAWINGS

Other features and advantages of the disclosure will appear from the following detailed description in relation with the appended drawings, in which.

DETAILED DESCRIPTION

Figure 1:
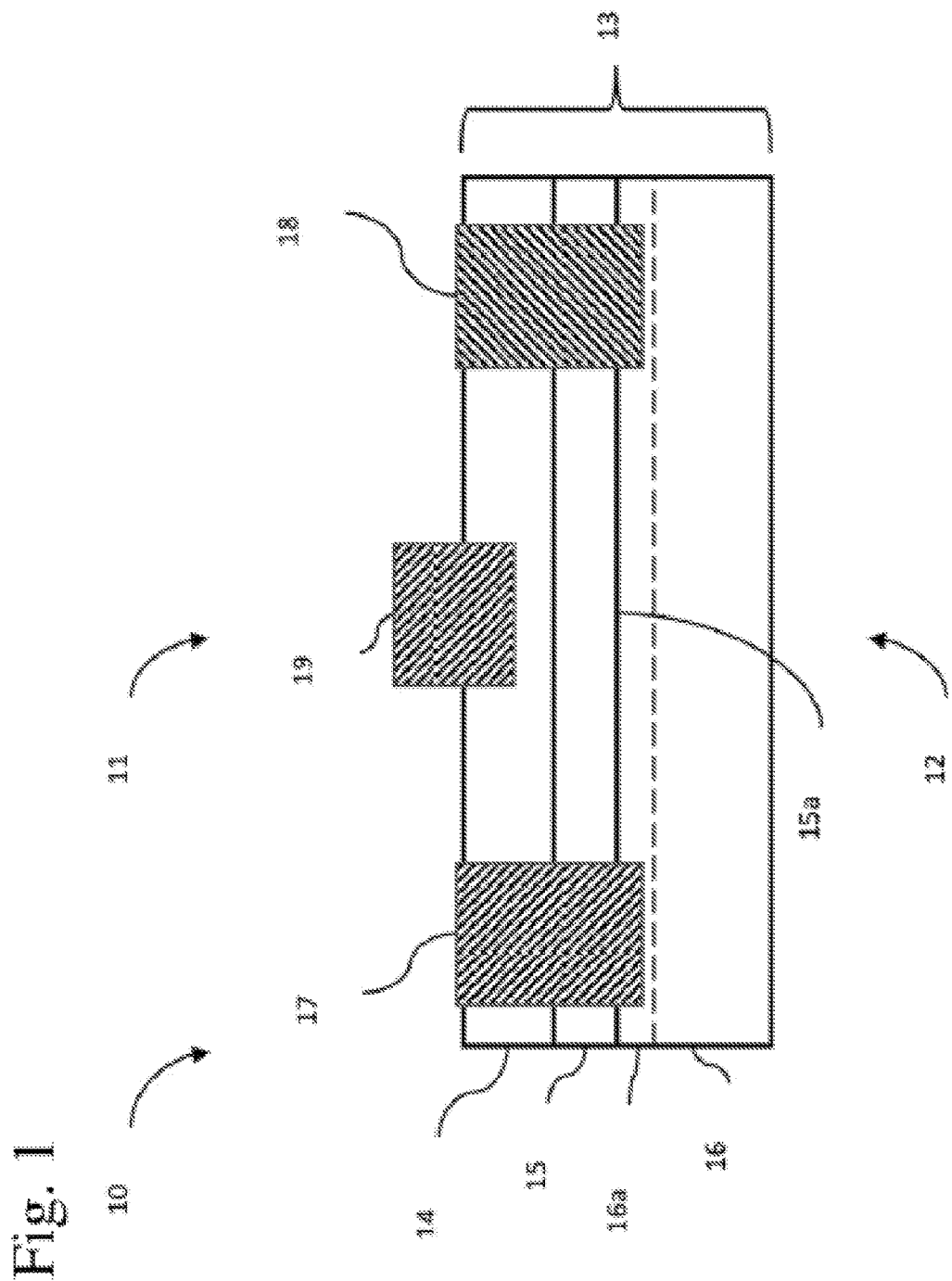
FIG. 1 is a simplified representation of a HEMT transistor, the HEMT transistor is shown along a cross-section plane perpendicular to the front side.

FIG. 1 shows a HEMT transistor 10. This HEMT transistor 10 is provided with a stack 13 which comprises, from a front side 11 to a back side 12, an insulator layer 14, a barrier layer 15, and a channel layer 16 capable of forming a conduction layer 16a in the form of a two-dimensional electron gas layer. In some implementations, conduction layer 16a extends in channel layer 16 from an interface 15a, formed between barrier layer 15 and said channel layer 16.

The III-V semiconductor materials selected to form barrier layer 15 and/or channel layer 16 may comprise gallium nitride (GaN), aluminum nitride (AlN), AlxGa1-xNx ternary alloys, gallium arsenide (GaAs), AlGaAs or InGaAs ternary alloys. For example, barrier layer 15 and channel layer 16 may respectively comprise an AlGaN compound and GaN. Insulator layer 14 may comprise a dielectric material, and in some implementations silicon dioxide ($SiO_2$) or silicon nitride (Si3N4).

HEMT transistor 10 also comprises a source electrode 17 and a drain electrode 18 in electric contact with conduction layer 16a. In some implementations, source electrode 17 and drain electrode 18 emerge through front surface 11, and cross insulator layer 14 and barrier layer 15 to reach interface 15a and electrically contact conduction layer 16a. Source electrode 17 and drain electrode 18 may partially or integrally cross conduction layer 16a. Source electrode 17 and drain electrode 18 may comprise a metal species, for example, aluminum, filling trenches formed in stack 13.

HEMT transistor 10 also comprises a gate electrode 19 intended to be imposed a voltage Vg enabling to control the state of conduction layer 16a. In some implementations, when the electric potential difference between gate electrode 19 and source electrode 17, noted Vg-Vs, is greater than a threshold voltage Vth characteristic of HEMT transistor 10, said transistor is in the conductive state. Conversely, when Vg-Vs is smaller than Vth, HEMT transistor 10 is in the non-conductive state, and thus behaves as an off switch.

Thus, depending on the value of threshold voltage Vth, and in some implementations on its sign, an HEMT transistor may be in depletion (normally-on) mode if its threshold voltage Vth is negative, or in enhancement (normally-off) mode if its threshold voltage Vth is positive.

Figure 2:
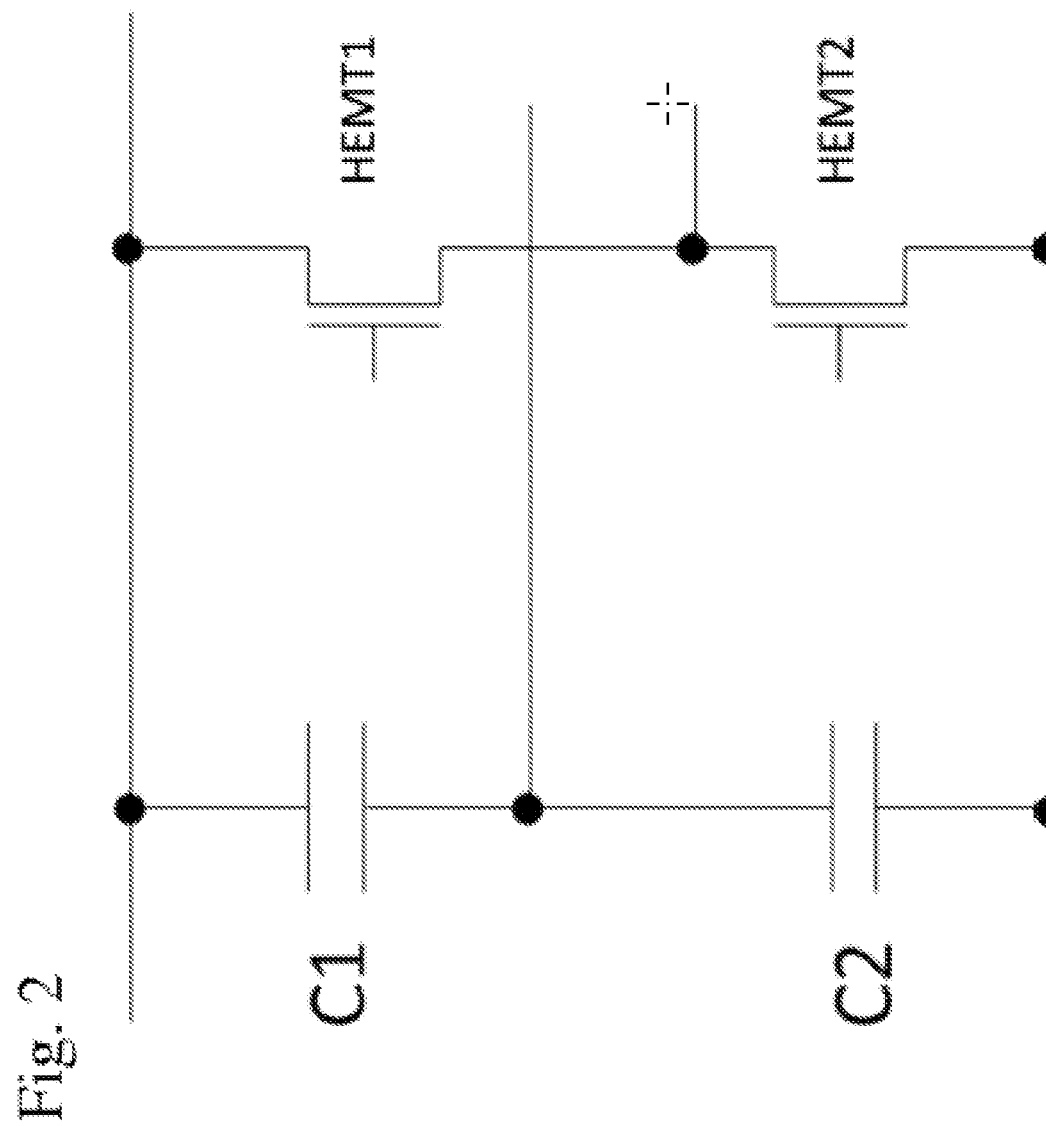
FIG. 2 is a functional representation of a half-arm bridge assembly implying the implementation of two transistors.

These HEMT transistors may in some implementations be implemented in the field of power conversion, and in some implementations to form bridge half-arms. This architecture, such as shown in FIG. 2, comprises two transistors, HEMT1 and HEMT2, assembled in series. In this example which shows an assembly used in power conversion, the latter is associated on the one hand to a capacitive bridge formed of capacitive elements C1 and C2, and on the other hand to a magnetic element.

Such an arrangement enables to optimize the use of the magnetic element.

It is however desirable to be able to implement HEMT transistors densely arranged in a half-arm of a bridge.

A solution comprising decreasing the size of HEMT transistors will have a negative impact on their on-state resistivity Ron, and it thus not desirable.

The present disclosure provides a compact arrangement of two HEMT transistors forming a half-arm of a bridge.

It should be understood that the different drawings shown in relation with the present description are given as an illustration only and by no way limit the disclosure. It should be clear that the relative scales or dimensions may not be respected.

All throughout the description, it is illustrated, as examples, that a layer or an interface is generally planar and extends along a plane parallel to the (0, x, y) plane of the (0, x, y, z) orthonormal reference frame. Further, when reference is made to a representation along a cross-section plane, the latter is perpendicular to all the planes formed by the layers, and in some implementations perpendicular to the (0, x, y) plane. It should also be understood that, when reference is made to a stack of layers, the latter are stacked along the z direction of the (0, x, y, z) orthonormal reference frame.

The present disclosure concerns an electronic device provided with two high electron mobility transistors (hereafter, "HEMT transistors") respectively referred to as first transistor and second transistor, and arranged in a bridge half-arm.

In some implementations, the electronic device comprises, from a first surface to a second surface, a first stack of layers and a second stack of layers respectively forming the first and the second transistor.

In this respect, the first and the second stack each comprise, from opposite surfaces of an insulating layer, interposed between the first and the second stack, a barrier layer and a channel layer. A channel layer of an HEMT transistor is in some implementations capable, when said HEMT transistor is in a conductive state, of forming a conduction layer in the form of a two-dimensional electron gas ("2DEG").

The first and the second transistor respectively comprise a first and a second set of electrodes. The first and the second set of electrodes are each provided with a source electrode, with a drain electrode, and with a gate electrode which are arranged so that the first and the second transistor form a bridge half-arm.

For a given HEMT transistor, the switching from one or the other of the conductive state and of the non-conductive state to the other one of these two states is controlled by the gate electrode of the concerned transistor. In some implementations, this control is executed by imposing a voltage Vg to the gate electrode. In some implementations, when the potential difference Vg-Vs between the gate electrode and the source electrode of the HEMT transistor is greater than its threshold voltage Vth, said transistor is in the conductive state and behaves as a conductive wire. Conversely, when potential difference Vg-Vs is smaller than the threshold voltage, the HEMT transistor is in a non-conductive state and behaves as an off switch.

A bridge half-arm according to the terms of the present disclosure is an arrangement of two series-connected HEMT transistors. In some implementations, the source electrode of the first transistor, referred to as first source electrode, is electrically connected to the drain electrode of the second transistor, referred to as second drain electrode. The arrangement also comprises three connection ports referred to as drain port, source port, and intermediate port. The drain port in some implementations enables to connect the drain electrode of the first transistor, the source port enables to connect the source electrode of the second transistor, and finally the intermediate port enables to connect the second drain electrode and the first source electrode.

Figure 3:
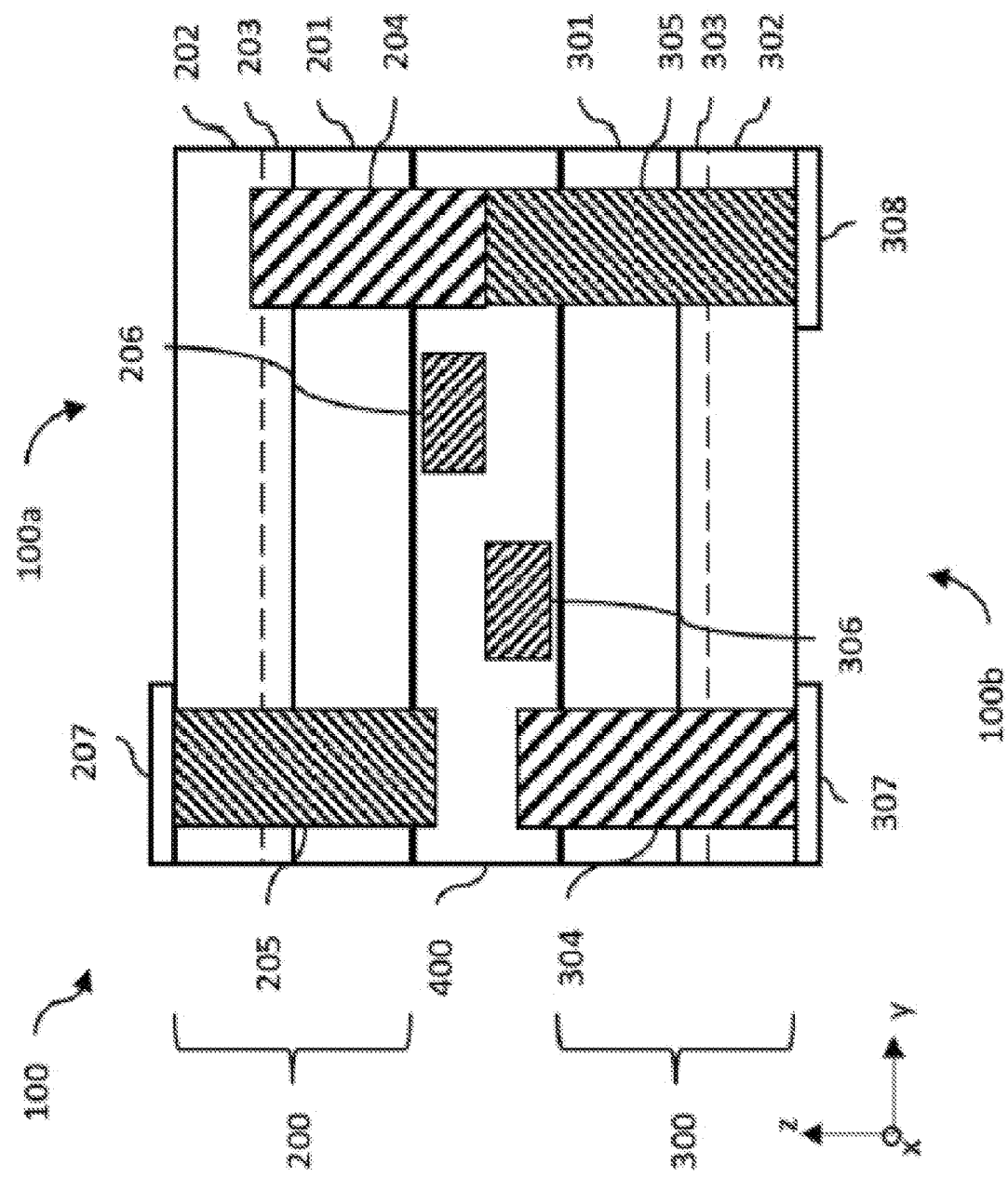
FIG. 3 is a simplified representation of an electronic device, along a cross-section plane running through the active area of said device, according to the present disclosure.

FIG. 3 schematically shows an electronic device 100 according to the terms of the present disclosure.

Device 100 in some implementations comprises two high electron mobility transistors (HEMT) respectively referred to as first transistor 200 and second transistor 300. In some implementations, device 100 comprises, from a first surface 100a to a second surface 100b, first transistor 200, an insulating layer 400, and second transistor 300.

Insulating layer 400 may comprise a dielectric material, in some implementations, silicon dioxide or silicon nitride.

First transistor 200 and second transistor 300 each comprise a stack of semiconductor layers respectively referred to as first stack and second stack.

Each stack of semiconductor layers may in some implementations comprise group-III-V semiconductor materials, and in some implementations group-III-N semiconductor materials. The group-III-V semiconductor materials may in some implementations be selected from among gallium nitride (GaN), aluminum nitride (AlN), and their $Al_xGa_{1-x}N$ ternary alloys, or from among gallium arsenide (GaAs) and its compounds (AlGaAs, InGaAs).

Each stack of semiconductor layers comprises, from the insulating layer, a barrier layer and a channel layer.

In some implementations, the first stack comprises, from insulating layer 400 to first surface 100a, a first barrier layer 201 and a first channel layer 202.

The second stack comprises, from insulating layer 400 to second surface 100b, a second barrier layer 301 and a second channel layer 302.

As an example and according to the present disclosure, a barrier layer may comprise an $Al_xGa_{1-x}N$ ternary alloy while a channel layer may comprise GaN.

Further, a barrier layer may have a thickness in the range from 1 nm to 100 nm.

A channel layer may have a thickness in the range from 10 nm to 2 µm.

The first and the second stack may be essentially identical.

A stack of semiconductor layers, according to the terms of the present disclosure, is capable of forming a two-dimensional electron gas (2DEG) layer or region, which forms a conduction layer.

The conduction layer, within a stack, extends in the channel layer, from the interface formed between the barrier layer and the channel layer of the considered stack. The conduction layer is in some implementations likely to be formed within a HEMT transistor when the latter is in a conductive state.

Thus, when first transistor 200 is in the conductive state, first channel layer 202 is capable of forming a first conduction layer 203 which extends in said first channel layer 202, from a first interface formed between first barrier layer 201 and first channel layer 202.

When second transistor 300 is in the conductive state, second channel layer 302 is capable of forming a second conduction layer 303 which extends in said second channel layer 202, from a second interface formed between second barrier layer 301 and second channel layer 302.

Each HEMT transistor comprises a set of electrodes provided with a source electrode, with a drain electrode, and with a gate electrode.

In some implementations, first transistor 200 comprises one of the two sets of electrodes referred to as first set. The first set is provided with a first source electrode 204, with a first drain electrode 205, and with a first gate electrode 206.

Second transistor 300 comprises the other one of the two sets of electrodes, referred to as second set. The second set is provided with a second source electrode 304, with a second drain electrode 305, and with a second gate electrode 306.

First source electrode 204 and first drain electrode 205 extend from insulating layer 400 towards the first stack. In some implementations, first drain electrode 205 and first source electrode 204 at least partly cross the first stack and partly cross first channel layer 202. Thus, one and the other of the first drain electrode 205 and of the first source electrode 204 electrically contact first channel layer 202 and in some implementations first conduction layer 203.

In some implementations, first drain electrode 205 emerges through first surface 100a. In this respect, the device may comprise a pad, referred to as drain pad 207, resting on first surface 100a and in contact with first drain electrode 205. This drain pad 207 forms a first terminal (or first port) of device 100. Drain pad 207 in some implementations comprises a doped semiconductor material, for example, doped silicon.

Second source electrode 304 and second drain electrode 305 extend from insulating layer 400 to the second stack. In some implementations, second drain electrode 305 and second source electrode 304 at least partly cross the second stack and in some implementations second channel layer 302. Thus, one and the other of second drain electrode 305 and of second source electrode 304 electrically contact second channel layer 302 and in some implementations second conduction layer 303.

In some implementations, second drain electrode 304 emerges through second surface 100b. In this respect, the device may comprise another pad, referred to as second source pad 307, resting on the second surface and in contact with the second drain electrode. This source pad 307 forms a second terminal (or second port) of electronic device 100. Source pad 307 in some implementations comprises a doped semiconductor material, for example, doped silicon.

In some implementations, first source electrode 204 and second drain electrode 305 are electrically connected to each other. In some implementations, first source electrode 204 and second drain electrode 305 form a single electrode, referred to as intermediate electrode, which extends from the first stack to the second stack.

In some implementations, the intermediate electrode may emerge by one of its ends, referred to as intermediate end, onto one or the other of first surface 100a and of second surface 100b. The intermediate electrode shown in FIG. 3 emerges at one of its ends through second surface 100b.

Electronic device 100 may also comprise, in line with the intermediate electrode by its intermediate end, an intermediate pad 308. Intermediate pad 308, which forms an intermediate terminal (or intermediate port), is in some implementations arranged on one or the other of the first surface and of the second surface. Intermediate pad 308, like the source pad and the drain pad, may comprise a doped semiconductor, for example, doped silicon.

First gate electrode 206 and second gate electrode 306 are configured to independently impose, respectively, to the first transistor and to the second transistor, the switching from one of the conductive and non-conductive states to the other one of these two states.

Thus, first gate electrode 206 is arranged to drive or control the state of first transistor 200. In some implementations, this control is executed by imposing an electric potential Vg to first gate electrode 206, and in some implementations an electric potential difference DDP, noted Vg-Vs between first gate electrode 206 and first source electrode 204.

Thus, when Vg-Vs is greater than a threshold voltage Vth characteristic of transistor 200, the latter is in the conductive state and behaves as a conductive wire. Conversely, when Vg-Vs is smaller than Vth, transistor 200 is in the non-conductive state, and thus behaves as an off switch.

Second gate electrode 306 is arranged to drive or control the state of second transistor 300. In some implementations, this control is executed by imposing an electric potential Vg to second gate electrode 306, and in some implementations an electric potential difference DDP, noted Vg-Vs between second gate electrode 306 and second source electrode 307.

Thus, when Vg-Vs is greater than a threshold voltage Vth characteristic of transistor 300, the latter is in the conductive state and behaves as a conductive wire. Conversely, when Vg-Vs is smaller than Vth, transistor 300 is in the non-conductive state, and thus behaves as an off switch.

Figure 4:
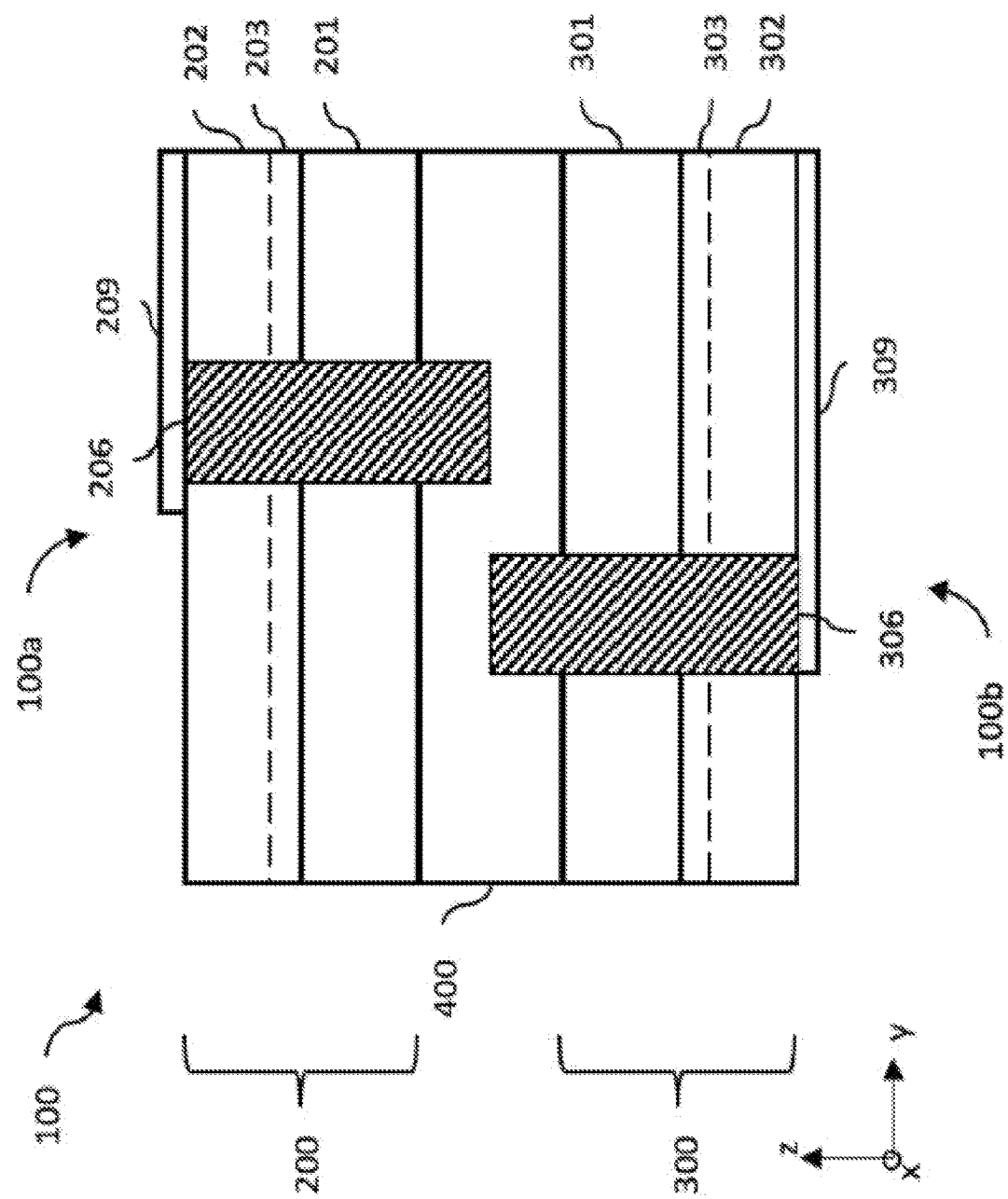
FIG. 4 is a representation illustrating the offset positioning of the first and of the second gate pad enabling to electrically connect the first and the second gate electrode of the electronic device of FIG. 3.
Figure 5:
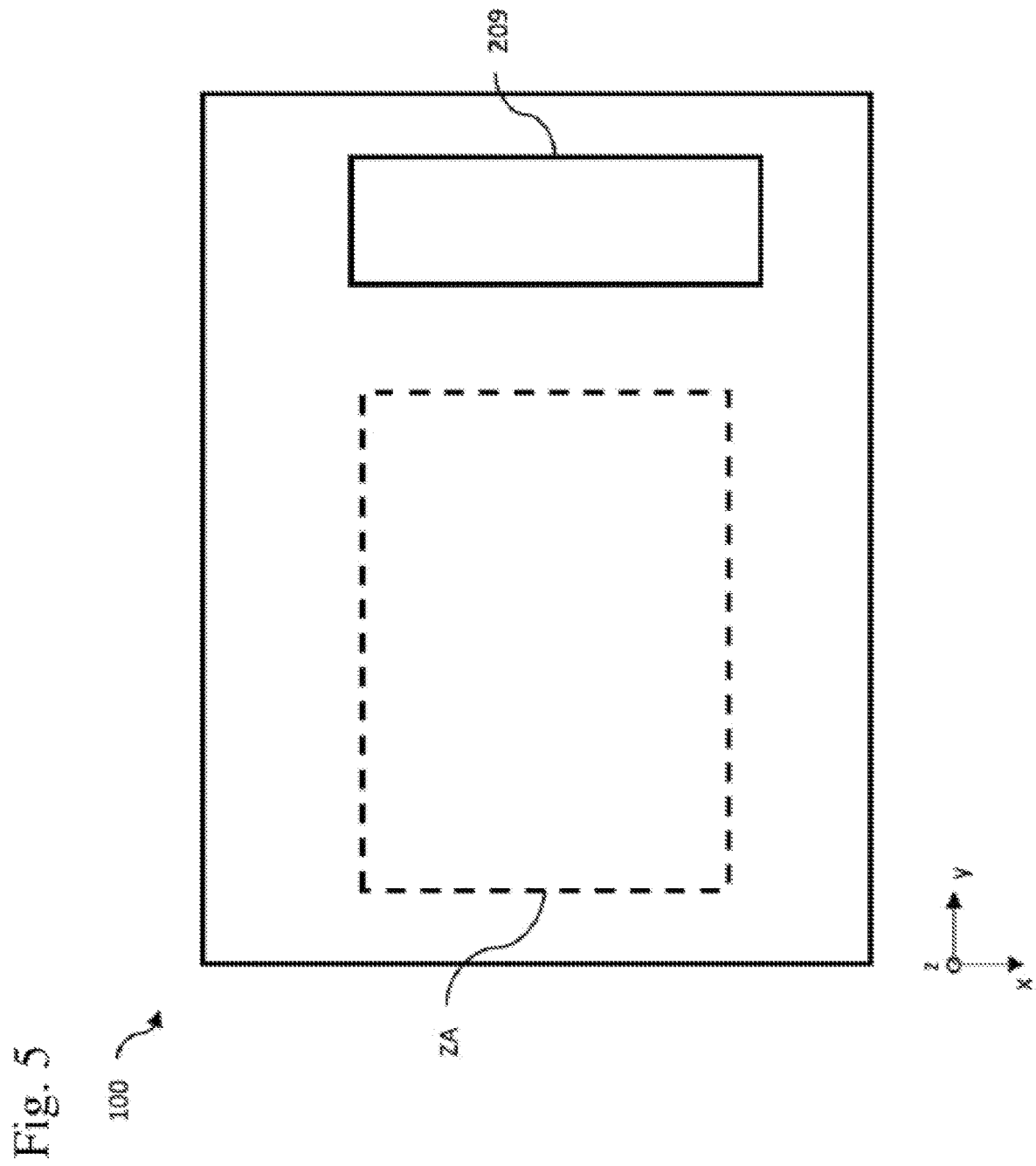
FIG. 5 is a representation illustrating the offset positioning of the first gate pad enabling to electrically connect the first gate electrode of the electronic device of FIG. 3 according to a view from the first surface of said device.

Electric device 100 may comprise two pads, referred to as first gate pad 209 and second gate pad 309, respectively arranged on first surface 100a and second surface 100b. In some implementations, first gate pad 209 and second gate pad 309 enable to electrically contact, respectively, first gate electrode 206 and second gate electrode 306 (FIG. 4). In some implementations, the two gate pads 209 and 309 are offset from the two active areas ZA of HEMT transistors 200 and 300 to avoid risking electrically contacting first conduction layer 203 and second conduction layer 303. "Offset" is used to designate a gate pad, which is arranged outside of a contour delimiting one and the other of the active areas ZA of the first and of the second transistor. In this respect, FIG. 5 is a representation of device 100 according to a view from the first surface (along a plan parallel to the (0, x, y) plane). The dotted lines delimit an active section ZA of the electronic device within which any contact between the first and the second gate electrode and one and the other of the barrier and channel layers is avoided. The first gate pad and the second gate pad may in some implementations comprise a doped semiconductor material.

In some implementations, the first stack and the second stack are essentially identical and mirror one another.

In some implementations still, the first and the second transistor have an identical threshold voltage.

In the architecture provided in the present disclosure, the conductive or non-conductive state of one and the other of the first and of the second transistor is controlled independently.

In some implementations, it is possible to impose a conductive state to the first transistor and a non-conductive state to the second transistor. According to this configuration, a current may flow in the electronic device from the first terminal to the intermediate terminal.

It is possible to impose a non-conductive state to the first transistor and a conductive state to the second transistor. According to this configuration, a current may flow in the electronic device from the intermediate terminal to the second terminal.

This operating mode may in some implementations be used in a conversion circuit 1000.

Figure 6:
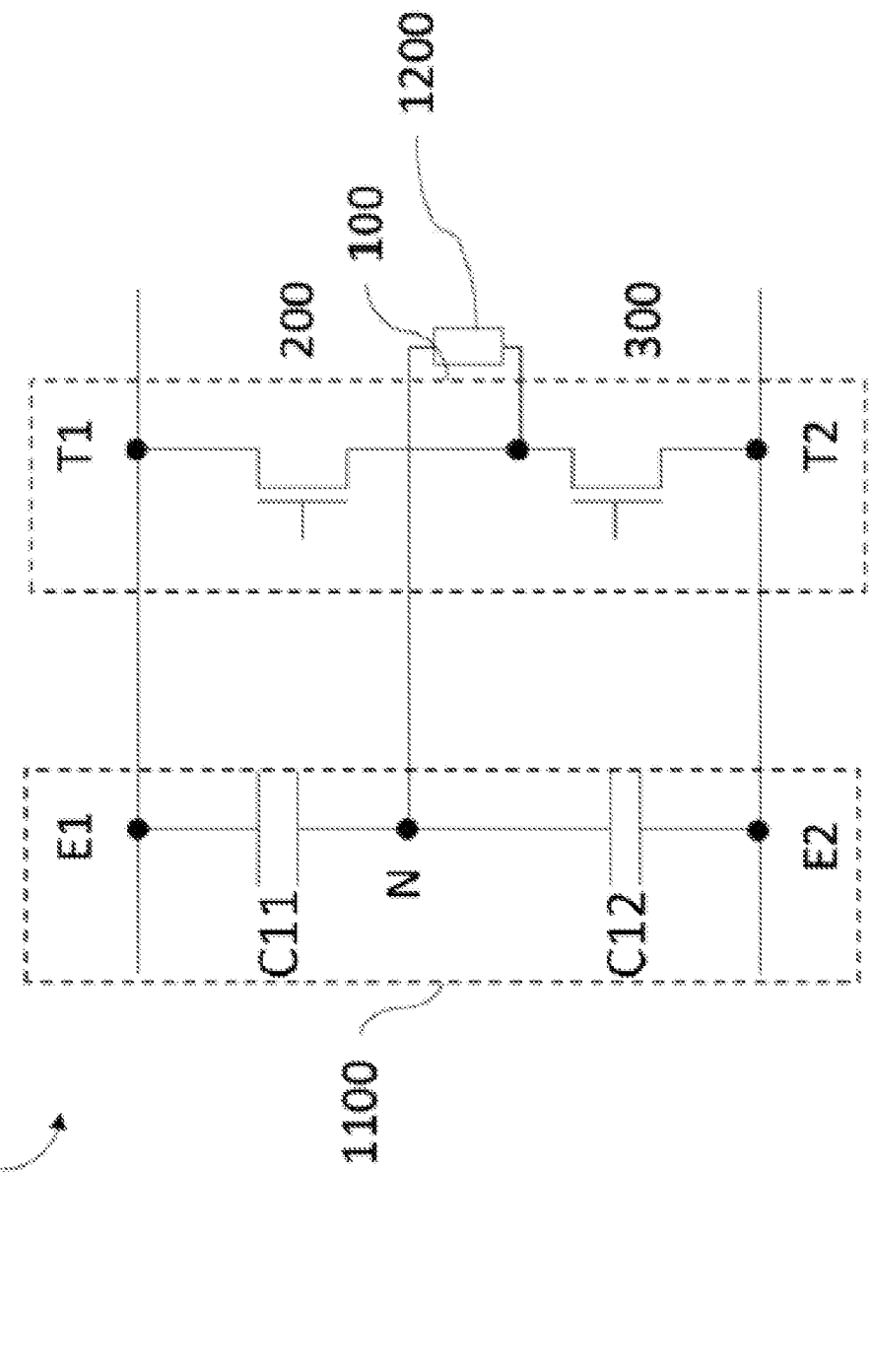
FIG. 6 is a simplified representation of the primary portion of a conversion circuit and which comprises the electronic device according to the present disclosure.

In this respect, FIG. 6 shows the primary portion of a conversion circuit 1000 and which comprises electronic device 100.

In some implementations, conversion circuit 1000 comprises a first branch 1100, a second branch formed by electronic device 100, as well as a magnetic element 1200, for example, a magnetic primary coil.

First branch 1100 in some implementations comprises, from a first end E1 to a second end E2, a first component C11 and a second component C12 connected in series and have a common terminal N. First component C11 and second component C12 may in some implementations comprise a diode or a capacitive element.

First end E1 and second end E2 are respectively connected to the first terminal T1 and the second terminal T2 of electronic device 100.

Magnetic element 1200 comprises two ends respectively connected to node N and to the intermediate terminal.

This arrangement of the primary portion of a conversion circuit 1000 with two HEMT transistors connected in a bridge half-arm enables to implement a single magnetic element. Indeed, each HEMT transistor cooperates therewith according to a 0.5 duty cycle, so that said magnetic element is implemented with no interruption.

This conversion circuit 1000 remains compact.

Figure 7:
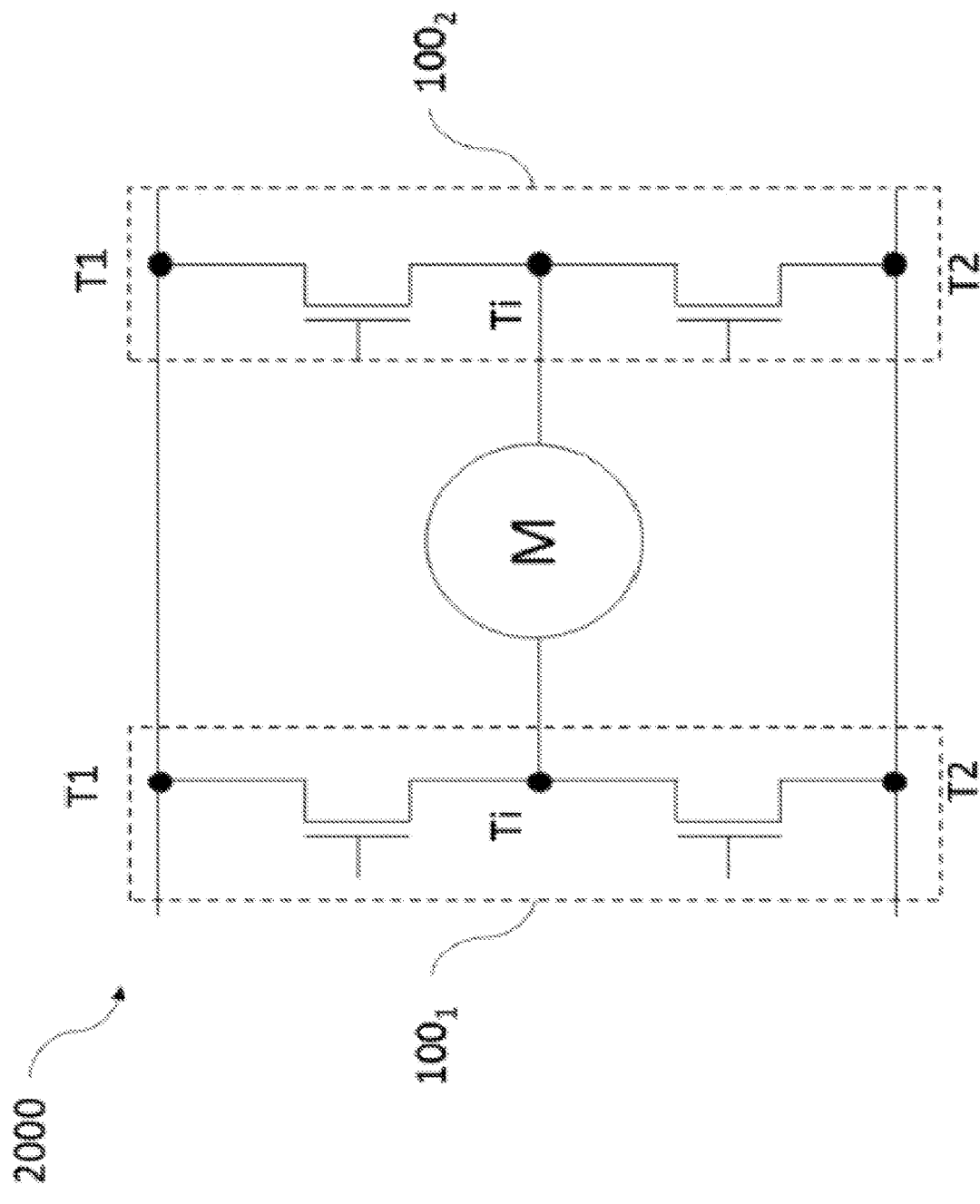
FIG. 7 is a simplified representation of a control circuit implementing two electronic devices according to the present disclosure.

Electronic device 100 may also be implemented for the forming of a circuit 2000 for controlling a motor M (illustrated in FIG. 7).

In some implementations, control circuit 2000 in some implementations comprises two electronic devices $100_1$ and $100_2$ according to the terms of the present disclosure connected in parallel. In some implementations, the first terminals T1 on the one hand and the second terminals T2 on the other hand of electronic devices $100_1$ and $100_2$ are connected to one another.

The two intermediate terminals Ti then form terminal to which a motor M may be connected.

In some implementations, the arrangement according to the present disclosure of two HEMT transistors, in the form of a stack, enables to keep an appreciable compactness without for all this affecting the on-state resistance Ron of the considered HEMT transistors.

Figure 8:
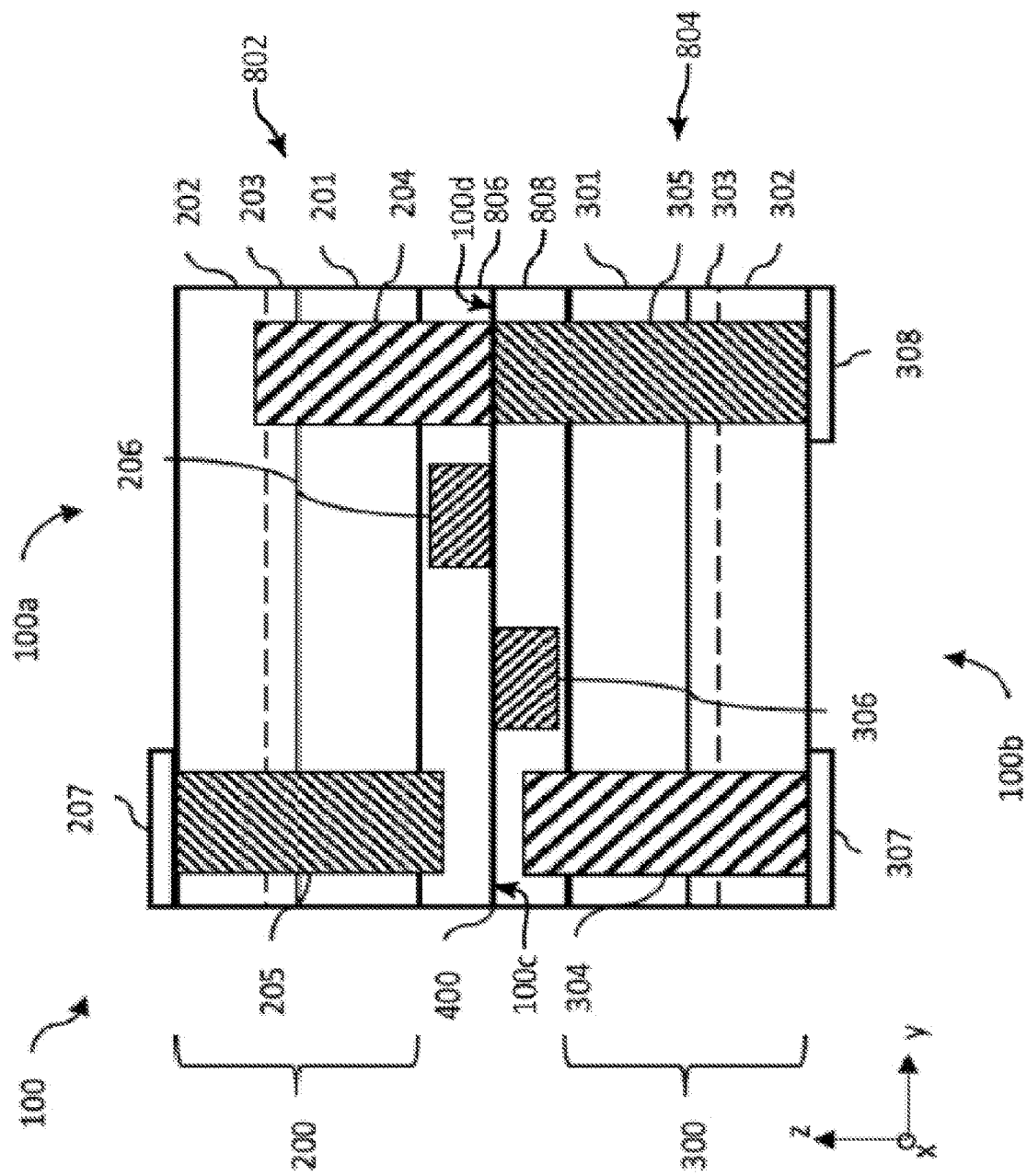
FIG. 8 shows a method according to the present disclosure.

FIG. 8 shows an example method of making the device 100. As shown in FIG. 8, two substrates 802 and 804 are received. Substrate 802 includes an insulating layer 806 and a first stack of layers 201, 202 formed on insulating layer 806. Substrate 802 includes surfaces 100a and 100c. Electrode 204 is exposed on surface 100c. Electrode 205 is not exposed on surface 100c, e.g., encapsulated by insulting layer 806 on surface 100c. Substrate 804 includes an insulating layer 808 and a second stack of layers 301, 302 formed on insulating layer 808. Substrate 804 includes surfaces 100b and 100d. Electrode 305 is exposed on surface 100d. Electrode 304 is not exposed on surface 100d, e.g., encapsulated by insulting layer 808 on surface 100d.

Substrates 802 and 804 are bonded together by surfaces 100c and 100d thereof, with exposed electrode 204 aligned with exposed electrode 305. Insulating layers 806 and 808 thus become insulating layer 400, e.g., of FIG. 3. Electrode 204 and electrode 305 form a single electrode. Electrode 205 is separated from electrode 304.

Of course, the disclosure is not limited to the described embodiments and alternative embodiments may be brought thereto without departing from the framework of the disclosure.

Electronic device (100) may be summarized as including, stacked from a first surface (100a) to a second surface (100*b*), a first stack and a second stack of two high electron mobility transistors, referred to as first (200) and second (300) transistor, the first and the second stack each including, from an insulating layer (400), interposed between the first and the second stack, a barrier layer (201, 301) and a channel layer (202, 302), the first (200) and the second (300) transistor respectively including a first and a second set of electrodes, the first and the second set of electrodes being each provided with a source electrode (204, 304), with a drain electrode (205, 305), and with a gate electrode (206, 306) which are arranged so that the first (200) and the second (300) transistor form a half-arm of a bridge.

The source electrode of the first transistor (200), referred to as first source electrode (204), and the drain electrode of the second transistor (300), referred to as second drain electrode (305), may be connected to each other.

The first source electrode (204) and the second drain electrode (305) may form a single electrode, referred to as intermediate electrode and which extends from the first stack to the second stack.

The intermediate electrode may emerge, by one of its ends referred to as intermediate end, flush with one or the other of the first end and of the second surface (100*a*, 100*b*).

An intermediate pad may be arranged on one of the first surface (100*a*) or of the second surface (100*b*) and in line with the intermediate electrode by its intermediate end, the intermediate pad (308) in some implementations may include a doped semiconductor material.

The drain electrode of the first transistor (200), referred to as first drain electrode (205), may extend in the insulator layer (400) and all the way into the channel layer (202) of said first stack, and the source electrode of the second transistor (300), referred to as second source electrode (304), may extend in the insulator layer (400) and all the way into the channel layer (302) of said second stack.

Said electronic device (100) may include a drain pad (207) and a source pad (307) arranged, respectively, on the first surface (100*a*) and the second surface (100*b*), and respectively contacting the first drain electrode (205) and the second source electrode (304), the drain pad (207) and the source pad (307) in some implementations may include a doped semiconductor material.

The channel layers (202, 302) of one and the other of the first and of the second transistor may be each capable of forming a conduction layer (203, 303) in the form of a two-dimensional electron gas.

The gate electrodes (206, 306) of one and the other of the first and of the second transistor, respectively referred to as first gate electrode (206) and second gate electrode (306), may be configured to independently impose, respectively, to the first transistor (200) and to the second transistor (300), the switching from one of the conductive and non-conductive states to the other one of these two states.

Said device also may include a first gate pad (209) and a second gate pad (309) respectively arranged on the first surface (100*a*) and the second surface (100*b*), the first gate pad (209) being configured to electrically contact the first gate electrode (206) and the second gate pad (309) being configured to electrically contact the second gate electrode (306), the first gate pad (209) and the second gate pad (309) in some implementations may include a doped semiconductor material.

The insulating layer (400) may include a dielectric material, in some implementations silicon dioxide or silicon nitride.

The first stack and the second stack may be essentially identical.

The first (200) and the second (300) transistor may have an identical threshold voltage.

The two channel layers (202, 302) may include GaN and the barrier layers (201, 301) may include an AlGaN ternary alloy.

The various embodiments described above can be combined to provide further embodiments. Aspects of the embodiments can be modified, if necessary to employ concepts of the various embodiments to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electronic device, comprising a first high electron mobility ("HEMT") transistor and a second HEMT transistor,
wherein the first HEMT transistor includes:
 a first stack of layers on a first surface of an insulating layer, the first stack of layers including a first channel layer and a first barrier layer between the first channel layer and the first surface of the insulating layer; and
 a first source electrode, a first drain electrode, and a first gate electrode; and
wherein the second HEMT transistor includes:
 a second stack of layers on a second surface of the insulating layer that is opposite to the first surface, the second stack of layer including a second channel layer and a second barrier layer between the second channel layer and the second surface of the insulating layer; and
 a second source electrode, a second drain electrode, and a second gate electrode, the second source electrode coupled to the first drain electrode.

2. The electronic device according to claim 1, wherein the first source electrode of the first HEMT transistor and the second drain electrode of the second transistor are connected to each other.

3. The electronic device according to claim 2, wherein the first source electrode and the second drain electrode are parts of a single electrode that extends from the first stack of layers to the second stack of layers.

4. The electronic device according to claim 3, wherein the single electrode emerges, on a side of the electronic device.

5. The electronic device according to claim 4, further comprising a first pad on the side of the electronic device and in contact with the single electrode, the first pad including a doped semiconductor material.

6. The electronic device according to claim 1, wherein the first drain electrode of the first HEMT transistor extends in the insulating layer and into the first channel layer of the first stack of layers, and wherein the second source electrode of the second HEMT transistor extends in the insulating layer and into the second channel layer of the second stack of layers.

7. The electronic device according to claim 6, further comprising a drain pad and a source pad on a first side and a second side of the electronic device, respectively, and in contact with the first drain electrode and the second source electrode, respectively, the drain pad and the source pad each including a doped semiconductor material.

8. The electronic device according to claim 1, wherein the first and second channel layers are each configured to form a region of two-dimensional electron gas.

9. The electronic device according to claim 1, wherein the first gate electrode and the second gate electrode are configured to control the first HEMT transistor and the second HEMT transistor, respectively, to switch between a conductive state and a non-conductive state independent to one another.

10. The electronic device according to claim 9, further comprising a first gate pad and a second gate pad on a first side and a second side of the electronic device, respectively, the first gate pad in contact with the first gate electrode and the second gate pad in contact with the second gate electrode, the first gate pad and the second gate pad each including a doped semiconductor material.

11. The electronic device according to claim 1, wherein the insulating layer comprises one or more of silicon dioxide or silicon nitride.

12. The electronic device according to claim 1, wherein the first stack of layers and the second stack of layers mirror one another.

13. The electronic device according to claim 1, wherein the first and the second HEMT transistors have a same threshold voltage.

14. The electronic device according claim 1, wherein the first and second channel layers each comprises GaN and the first and second barrier layers each comprises an AlGaN ternary alloy.

15. A structure, comprising:
an insulating layer;
a first stack of layers on a first surface of the insulating layer, the first stack of layers including a first group III-V semiconductor layer and a second group III-V semiconductor layer having a different semiconductor material from the first group III-V semiconductor layer, the second group III-V semiconductor layer between the first group III-V semiconductor layer and the first surface of the insulating layer;
a second stack of layers on a second surface of the insulating layer that is opposite to the first surface, the second stack of layers including a third group III-V semiconductor layer and a fourth group III-V semiconductor layer having a different semiconductor material from the third group III-V semiconductor layer, the fourth group III-V semiconductor layer between the third group III-V semiconductor layer and the second surface of the insulating layer;
a first electrode in contact with the first group III-V semiconductor layer;
a second electrode in contact with the first group III-V semiconductor layer, the second electrode separated from the first electrode;
a third electrode in contact with the third group III-V semiconductor layer and the first electrode, the third electrode separated from the second electrode; and
a fourth electrode in contact with the third group III-V semiconductor layer, the fourth electrode separated from each one of the third electrode, the second electrode or the first electrode.

16. The structure of claim 15, wherein the third electrode and the first electrode are parts of a single conductive structure.

17. The structure of claim 15, wherein the first, second, third, and fourth electrodes each extends in the insulating layer.

18. The structure of claim 15, wherein the first group III-V semiconductor layer and the third group III-V semiconductor layer are each gallium nitride.

19. A device comprising:
an insulating layer having a first surface opposite a second surface along a first direction;
a first high electron mobility ("HEMT") transistor including:
a first stack of layers on the first surface of the insulating layer, the first stack of layers including a first channel layer and a first barrier layer between the first channel layer and the first surface of the insulating layer;
a first source electrode extending along the first direction from the insulating layer entirely through the first barrier layer and through a first portion of the first channel layer;
a first drain electrode extending along the first direction from the insulating layer entirely through the first barrier layer and through a second portion of the first channel layer; and
a first gate electrode; and
a second HEMT transistor including:
a second stack of layers on the second surface of the insulating layer, the second stack of layer including a second channel layer and a second barrier layer between the second channel layer and the second surface of the insulating layer; and
a second source electrode, a second drain electrode, and a second gate electrode, the second source electrode coupled to the first drain electrode.

20. The device of claim 1, wherein the second source electrode extends along the first direction from a first side of the second channel layer opposite the barrier layer to the insulating layer, and the second drain electrode extends from the first side of the second channel layer to the insulating layer.

* * * * *